United States Patent
Kuo et al.

(10) Patent No.: US 6,240,004 B1
(45) Date of Patent: May 29, 2001

(54) LOW-VOLTAGE CONTENT ADDRESSABLE MEMORY CELL WITH A FAST TAG-COMPARE CAPABILITY USING PARTIALLY-DEPLETED SOI CMOS DYNAMIC-THRESHOLD TECHNIQUES

(76) Inventors: James B. Kuo; Sheng-Che Liu, both of Department of Electrical Engineering National Taiwan University Roosevelt Road. Sec. 4, Taipei (TW)

( * ) Notice: Subject to any disclaimer, the term of this patent is extended or adjusted under 35 U.S.C. 154(b) by 0 days.

(21) Appl. No.: 09/597,275

(22) Filed: Jun. 19, 2000

(51) Int. Cl.[7] .................................................. G11C 15/00
(52) U.S. Cl. .............................................. 365/49; 365/154
(58) Field of Search ............................ 365/49, 154, 155, 365/156

(56) References Cited

U.S. PATENT DOCUMENTS 5,999,435 * 12/1999 Henderson et al. ..................... 365/49
6,078,513 * 6/2000 Ong et al. ............................... 365/49
6,157,558 * 12/2000 Wong ...................................... 365/49
6,175,514 * 1/2001 Henderson et al. ..................... 365/49

* cited by examiner

Primary Examiner—Vu A. Le
Assistant Examiner—Anh Phung
(74) Attorney, Agent, or Firm—Bacon & Thomas, PLLC

(57) ABSTRACT

This invention discloses a content addressable memory (CAM) cell having a SRAM portion and a tag-compare portion. The tag-compare portion includes six NMOS transistors, designated as M7 to M12, wherein a source of M7 is connected to a drain of M8, a drain of M7 is connected to a match line ML, a source of M8 is grounded; a body of M7 and a body of M8 are tied together at a source of M11, a gate of M7 and a gate of M11 are tied together to a first node n1, a gate of M8 and a drain of M11 are connected to a first digit line DLB; and a source of M9 is connected to a drain of M10, a drain of M9 is connected to said match line ML, a source of M10 is grounded; a body of M9 and a body of M10 are tied together at a source of M12, a gate of M9 and a gate of M12 are tied together to a second node n2, a gate of M10 and a drain of M12 are connected to a second digit line DL. The first and second nodes n1 and n2 are internal storage nodes of the SRAM portion.

2 Claims, 3 Drawing Sheets

LOW-VOLTAGE CONTENT ADDRESSABLE MEMORY CELL WITH A FAST TAG-COMPARE CAPABILITY USING PARTIALLY-DEPLETED SOI CMOS DYNAMIC-THRESHOLD TECHNIQUES

SUMMARY OF THE INVENTION

The present invention is related to a novel low-voltage content addressable memory (CAM) cell with a fast tag-compare capability using partially-depleted (PD) SOI CMOS dynamic-threshold (DTMOS) techniques.

BACKGROUND OF THE INVENTION

Content addressable memory (CAM) has been broadly used in many VLSI system applications such as imaging processing, network communication, and parallel data processing to facilitate operations of fast comparison and validation of patterns [J. B. Kuo and J. H. Lou, "Low-Voltage CMOS VLSI Circuits," John Wiley: New York, ISBN 0471321052, 1999]. As shown in FIG. 1, in a conventional 10T CAM cell [H. Kadota, J. Miyake, Y. Nishimichi, H. Kudoh, and K. Kagawa, "An 8-kbit Content-Addressable and Reentrant Memory," IEEE Journal of Solid-State Circuits, Vol. 20, No. 5, pp 951–957, 1985], it is composed of two portions: the SRAM portion (transistors M1–M6) and the tag-compare portion—transistors M7~M10 for performing the XOR operation of the data stored in the SRAM cell with the input data at the digit lines.

Said SRAM portion comprises two PMOS's, designated as M1 and M2; and four NMOS's, designated as M3, M4, M5 and M6, wherein a drain of the NMOS M3 is connected to that of the PMOS M1 at a first node n1 while their gates are tied together at a second node n2; a source of the PMOS M1 is connected to a supply voltage $V_{DD}$; a drain of the NMOS M4 is connected to that of the PMOS M2 at the second node n2 while their gates are tied together at the first node n1; a source of the NMOS M4 is grounded and that of the PMOS M2 is connected to the supply voltage $V_{DD}$; the NMOS M5 and NMOS M6 are pass transistors, one of them M5 is controlled by a word line WL via its gate, and its drain and source are connected to a first bit line BL and the first node n1 respectively; another one of them M6 is controlled by the word line WL via its gate, and its drain and source are connected to a second bit line BLB and the second node n2 respectively.

If logc-1 is stored at the internal storage node n1, which is different from the logic state of the data on the digit line (DL), then the match line (ML) is pulled down to ground, indicating a miss. Along with the increased complexity of the related VLSI systems, the speed performance of the tag-compare operation of a related large-size CAM circuit has become a bottleneck for high-speed applications, which is especially serious for operation using a low supply voltage. Recently, CMOS dynamic threshold (DTMOS) techniques have been reported for their advantages in low-voltage SOI CMOS VLSI circuits [F. Assaderaghi, D. Sinitsky, S. A. Parke, J. Bokor, P. K. Ko, and C. Hu, "Dynamic Threshold-Voltage MOSFET (DTMOS) for Ultra-Low Voltage VLSI," IEEE Transactions on Electron Devices, Vol. 44, No. 3, pp 414–422, 1997; N. Lindert, T. Sugii, S. Tang and C. Hu, "Dynamic Threshold Pass-Transistor Logic for Improved Delay at Low Power Supply Voltages," IEEE Journal of Solid-State Circuits, Vol. 34, No. 1, pp 85–89, 1999; I. Y. Chung, Y. J. Park, and H. S. Min, "A New SOI Inverter Using Dynamic Threshold for Low-Power Applications," IEEE Electron Devices Letters, Vol. 18, No. 6, pp 248–250, 1997].

SUMMARY OF THE INVENTION

The present invention discloses a content addressable memory cell comprising a tag-compare portion comprising six NMOS transistors, designated as M7 to M12, wherein a source of M7 is connected to a drain of M8, a drain of M7 is connected to a match line, a source of M8 is grounded; a body of M7 and a body of M8 are tied together at a source of M11, a gate of M7 and a gate of M11 are tied together to a first node n1, a gate of M8 and a drain of M11 are connected to a first digit line; and a source of M9 is connected to a drain of M10, a drain of M9 is connected to said match line, a source of M10 is grounded; a body of M9 and a body of M10 are tied together at a source of M12, a gate of M9 and a gate of M12 are tied together to a second node n2, a gate of M10 and a drain of M12 are connected to a second digit line.

Preferably, the content addressable memory cell of the present invention further comprises a SRAM portion containing said first node n1 and said second node n2, wherein said SRAM portion comprises two PMOS's, designated as M1 and M2; and four NMOS's, designated as M3, M4, M5 and M6, wherein a drain of the NMOS M3 is connected to that of the PMOS M1 at said first node n1 while their gates are tied together at said second node n2; a source of the PMOS M1 is connected to a supply voltage $V_{DD}$; a drain of the NMOS M4 is connected to that of the PMOS M2 at the second node n2 while their gates are tied together at the first node n1; a source of the NMOS M4 is grounded and that of the PMOS M2 is connected to the supply voltage $V_{DD}$; the NMOS M5 and NMOS M6 are pass transistors, one of them MS is controlled by a word line via its gate, and its drain and source are connected to a first bit line and the first node n1 respectively; another one of them M6 is controlled by the word line via its gate, and its drain and source are connected to a second bit line and the second node n2 respectively.

In one of the preferred embodiments of the present invention, a novel low-voltage content addressable memory (CAM) cell with a fast tag-compare capability using partially-depleted (PD) SOI CMOS dynamic-threshold (DTMOS) techniques was proposed. Using two auxiliary pass transistors (M11, M12) to dynamically control the bodies of transistors in the tag-compare portion of CAM cell, this SOI CAM cell has a fast tag-compare capability at a low supply voltage of 0.7V as verified by the MEDICI results.

DETAILED DESCRIPTION OF THE INVENTION

In the present invention, a low-voltage CAM cell structure with a fast tag-compare capability using partially-depleted (PD) SOI CMOS dynamic-threshold (DTMOS)

techniques is described. In the following sections, the new SOI CAM circuit and its operation are described first, followed by performance evaluation.

I. Low-Voltage SOI CAM Cell

Figure 1:
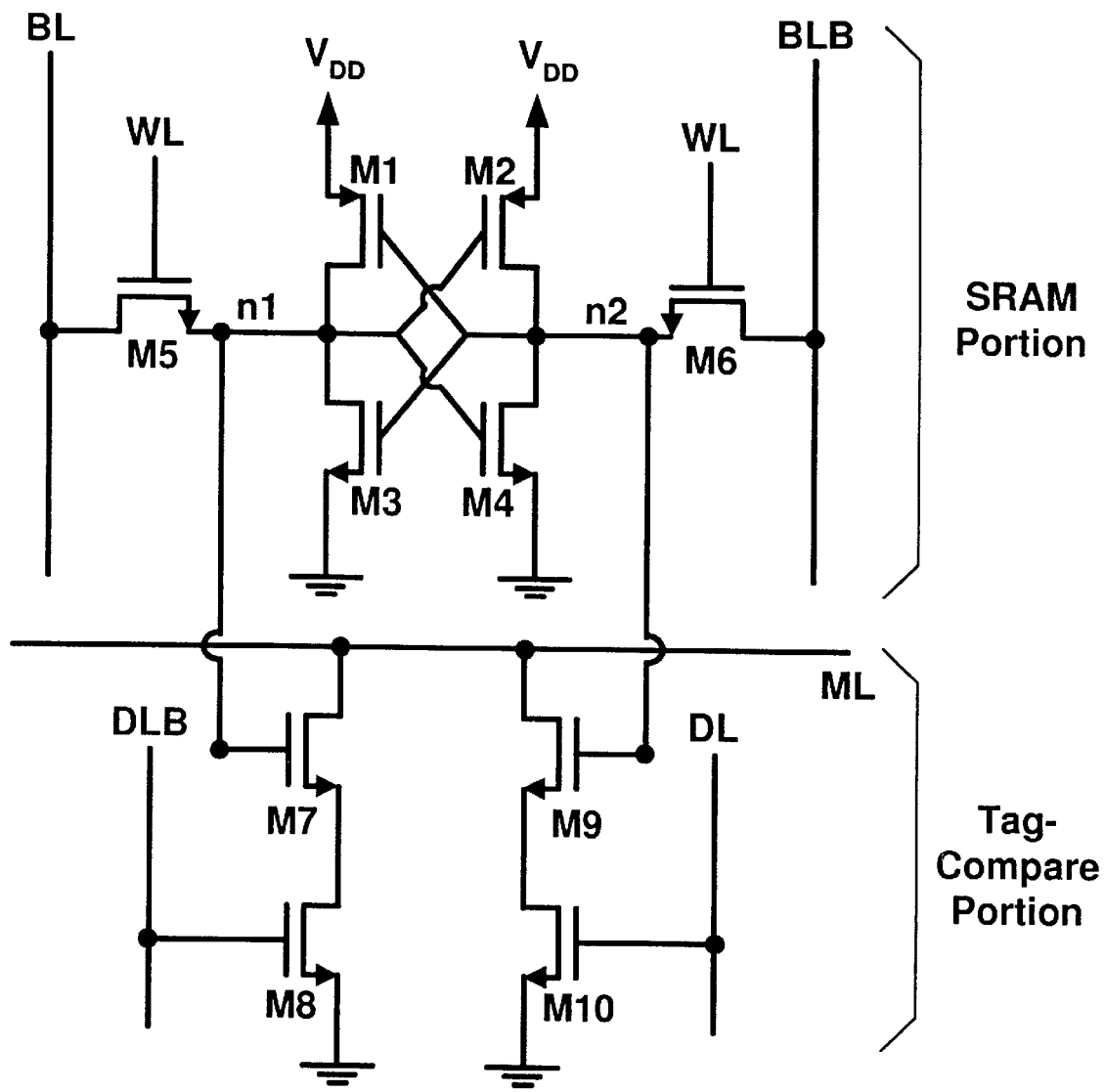
FIG. 1 is a schematic diagram showing a structure of the conventional content addressable memory (CAM) cell.
Figure 2:
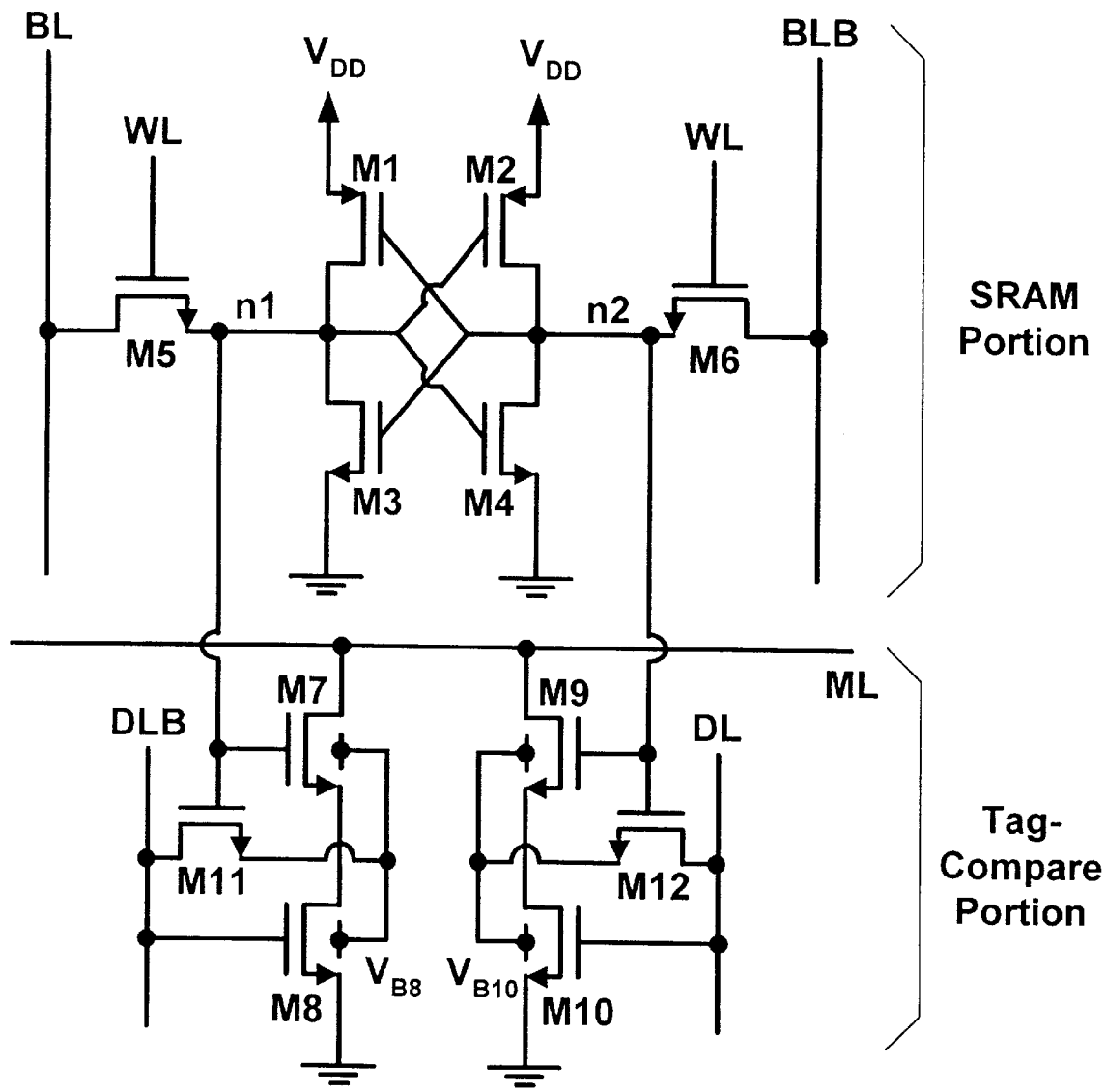
FIG. 2 is a schematic diagram showing a low-voltage content addressable memory (CAM) cell with a fast tag-compare capability using partially-depleted (PD) SOI DTMOS techniques of the present invention.

FIG. 2 shows the new low-voltage content addressable memory (CAM) cell with a fast tag-compare capability using partially-depleted (PD) SOI DTMOS techniques according to the present invention. As shown in the figure, there are 12 transistors in the new CAM cell—in addition to the ten transistors for the SRAM cell portion and the tag-compare portion as in the conventional CAM cell (FIG. 1), two auxiliary transistors M11 and M12, which are controlled by the internal storage nodes of the SRAM cell, for controlling the bodies of transistors M7–M10 have been added to the tag-compare portion. Digit lines DL and DLB are connected to the drain of transistors M12 and M11. In addition, digit lines DL and DLB also control the turn-on of transistors M8 and M10. Using this arrangement, either transistor M11 or M12 turns on depending on the data stored in the SRAM cell. If the internal storage node n1 in the memory cell is high, both transistors M7 and M11 turn on and both transistors M9 and M12 are off. Prior to the tag-compare operation, both digit lines DL and DLB are low and the match line ML is precharged to high. Since transistor M11 is on, the bodies of transistors M7 and M8 are tied to low via transistor M11. During the tag-compare operation, if logic-0 exists on the digit line DL (logic-1 exists on the complementary digit line DLB), transistor M8 turns on. Due to the logic-1 status on the complementary digit line DLB, the threshold voltages of both transistors M7 and M8 are lowered since the bodies of transistors M7 and M8 are high. As a result, the match line ML is discharged to ground via transistors M7 and M8 indicating a miss, much faster owing to the increased conductance of transistors M7 and M8 from the DTMOS techniques, as compared to the conventional CAM cell case without the DTMOS techniques. When the tag-compare procedure is over, the complementary digit line DLB is back to low. Therefore, transistor M7 remains on and M8 turns off with their threshold voltages restored to their zero-biased values since their bodies are tied to zero by transistor M11, which implies that the leakage current in transistor M8 stays low as in the case with the DTMOS techniques.

Consider the other case with that the digit line DL is high and the complementary digit line DLB is low. During the tag-compare operation, the threshold voltages of both transistors M7 and M8 maintain their zero-biased values since their bodies are tied to low via transistor M11, which is turned on by the logic-1 state of the internal storage node n1. Therefore, the leakage current of transistor M8, which is turned off by the logic-0 state of the complementary digit line DLB, is identical to the case without the DTMOS techniques. On the other side, transistor M10 is on since the digit line DL is high. In addition, both transistors M9 and M12 are off since the internal storage node n2 is low. Therefore, the threshold voltages of both transistors M9 and M10 are not decreased since their bodies are disconnected from the digit line DL. This implies that the leakage current in transistor M9 stays low. Consequently, the match line ML maintains its precharged high state owing to small leakage currents in both non-conducting paths of transistors M7/M8 and M9/M10.

II. Performance Evaluation

Figure 3:
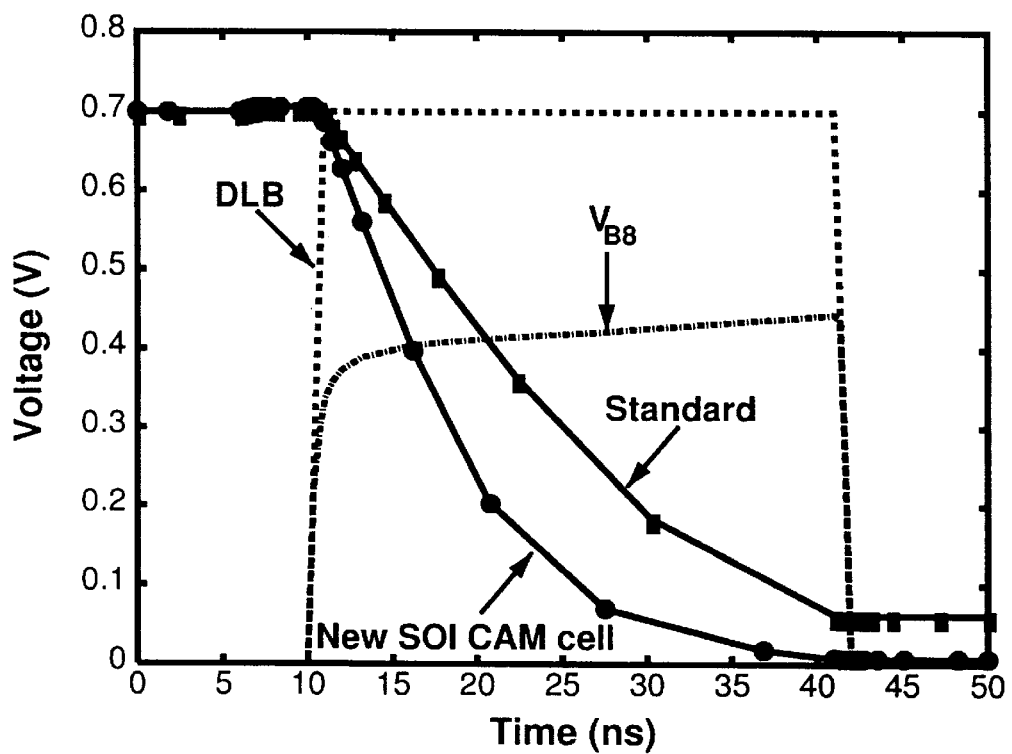
FIG. 3 is a time (ns) versus voltage (V) plot showing the match line (ML), the digit line (DLB), and the body voltage ($V_{BS}$) waveforms during the tag-compare transient of the low-voltage SOI CAM cell proposed in FIG. 2 and the conventional CAM cell shown in FIG. 1 under the 'miss' condition at $V_{DD}$ of 0.7V based on MEDICI results.

In order to investigate the effectiveness of this low-voltage CAM cell structure using partially-depleted (PD) SOI DTMOS techniques, transient performance during the tag-compare operation at $V_{DD}$ of 0.7V has been studied. In the SOI CAM cell under study, all 12 transistors have an aspect ratio of 0.2 $\mu$m/0.2 $\mu$m. A parasitic capacitance of 0.25 pF is placed at the match line ML. At the internal storage node n1 of the SRAM cell, a logic-1 value is assumed. Initially, the match line ML is precharged to high at 0.7V prior to the tag-compare operation. FIG. 3 shows the match line (ML), the complementary digit line (DLB), and the body voltage waveforms during the tag-compare transient of the new low-voltage SOI CAM cell using DTMOS techniques and the conventional CAM cell under the 'miss' condition at $V_{DD}$ of 0.7V based on MEDICI results ["MEDICI: Two-dimensional semiconductor device simulation," Technology Modeling Associates, Inc., Palo Alto, Calif., 1996]. As shown in the figure, after the tag-compare operation is initiated at 10 ns, the complementary digit line DLB is changed from logic-0 to logic-1 and the digit line DL remains at logic-0 accordingly. After the complementary digit line DLB switches to high at 0.7V, the bodies of both transistors M7 and M8 are raised to above 0.4V by transistor M11. As a result, the match line ML is pulled down to 0V quickly. Note that the bodies of both transistors M7 and M8 cannot reach 0.7V due to the body effect. As shown in the figure, the pull-down time of the tag-compare operation for a miss is much faster for the SOI CAM cell using the DTMOS techniques, as compared to that of conventional CAM cell.

What is claimed is:

1. A content addressable memory cell comprising a tag-compare portion comprising six NMOS transistors, designated as M7 to M12, wherein a source of M7 is connected to a drain of M8, a drain of M7 is connected to a match line, a source of M8 is grounded; a body of M7 and a body of M8 are tied together at a source of M11, a gate of M7 and a gate of M11 are tied together to a first node n1, a gate of M8 and a drain of M11 are connected to a first digit line; and a source of M9 is connected to a drain of M10, a drain of M9 is connected to said match line, a source of M10 is grounded; a body of M9 and a body of M10 are tied together at a source of M12, a gate of M9 and a gate of M12 are tied together to a second node n2, a gate of M10 and a drain of M12 are connected to a second digit line.

2. The content addressable memory cell according to claim 1 further comprising a SRAM portion containing said first node n1 and said second node n2, wherein said SRAM portion comprises two PMOS's, designated as M1 and M2; and four NMOS's, designated as M3, M4, M5 and M6, wherein a drain of the NMOS M3 is connected to that of the PMOS M1 at said first node n1 while their gates are tied together at said second node n2; a source of the PMOS M1 is connected to a supply voltage $V_{dd}$; a drain of the NMOS M4 is connected to that of the PMOS M2 at the second node n2 while their gates are tied together at the first node n1; a source of the NMOS M4 is grounded and that of the PMOS M2 is connected to the supply voltage $V_{dd}$; the NMOS M5 and NMOS M6 are pass transistors, one of them M5 is controlled by a word line via its gate, and its drain and source are connected to a first bit line and the first node n1 respectively; another one of them M6 is controlled by the word line via its gate, and its drain and source are connected to a second bit line and the second node n2 respectively.

\* \* \* \* \*